(12) United States Patent
Sasaki et al.

(10) Patent No.: US 9,786,531 B2
(45) Date of Patent: Oct. 10, 2017

(54) GAS PURGE UNIT, LOAD PORT APPARATUS, AND INSTALLATION STAND FOR PURGING CONTAINER

(71) Applicant: TDK Corporation, Minato-ku, Tokyo (JP)

(72) Inventors: Mutsuo Sasaki, Tokyo (JP); Jun Emoto, Tokyo (JP); Hiroshi Igarashi, Tokyo (JP)

(73) Assignee: TDK Corporation, Tokyo (JP)

( * ) Notice: Subject to any disclaimer, the term of this patent is extended or adjusted under 35 U.S.C. 154(b) by 411 days.

(21) Appl. No.: 14/554,851

(22) Filed: Nov. 26, 2014

(65) Prior Publication Data

US 2016/0038982 A1 Feb. 11, 2016

(30) Foreign Application Priority Data

Aug. 8, 2014 (JP) ................ 2014-162601

(51) Int. Cl.
  *B08B 5/02* (2006.01)
  *H01L 21/673* (2006.01)
  *B08B 9/00* (2006.01)
  *H01L 21/677* (2006.01)
(52) U.S. Cl.
  CPC .. *H01L 21/67393* (2013.01); *H01L 21/67772* (2013.01); *H01L 21/67775* (2013.01); *B08B 9/00* (2013.01)
(58) Field of Classification Search
  CPC ......... H01L 21/67393; H01L 21/67772; H01L 21/67775; H01L 21/67389; B08B 5/02; B08B 9/00
  See application file for complete search history.

(56) References Cited

U.S. PATENT DOCUMENTS

| | | | | |
|---|---|---|---|---|
| 5,320,218 A | * | 6/1994 | Yamashita | ........ H01L 21/67393 118/500 |
| 5,911,249 A | * | 6/1999 | Sanfilippo | ............. B65B 31/041 141/11 |
| 7,950,524 B2 | * | 5/2011 | Lin | ........................ F16K 15/147 118/715 |
| 8,061,738 B2 | * | 11/2011 | Okabe | .................... F16J 15/002 15/301 |
| 8,418,733 B2 | * | 4/2013 | Shikata | ..................... G03F 1/00 141/4 |
| 9,105,673 B2 | * | 8/2015 | Babbs | ............... H01L 21/67201 |
| 2005/0069420 A1 | * | 3/2005 | Miyajima | ......... H01L 21/67017 417/53 |

FOREIGN PATENT DOCUMENTS

| | | |
|---|---|---|
| JP | 2010-182747 A | 8/2010 |
| JP | 2012-164948 A | 8/2012 |
| JP | 2014-036185 A | 2/2014 |

* cited by examiner

Primary Examiner — Dung Van Nguyen
(74) Attorney, Agent, or Firm — Arent Fox LLP

(57) ABSTRACT

A gas purge unit includes an intake nozzle 28, a pivotable body 31, and an O-ring 35. The intake nozzle 28 has a nozzle opening 26 flowing out a cleaning gas. The pivotable body 31 is arranged in a ring shape to surround a cylindrical projection 28b of the nozzle 28, and is provided with a contact part 34 formed on a tip portion of the pivotable body 31 to be able to detachably contact with the intake port 5. The ring-shaped O-ring 35 is held to be compressively elastically deformable along a longitudinal direction of the cylindrical projection 28b between a rear end of the pivotable body 31 and a base portion 28a of the nozzle 28.

19 Claims, 12 Drawing Sheets

FIG. 3A
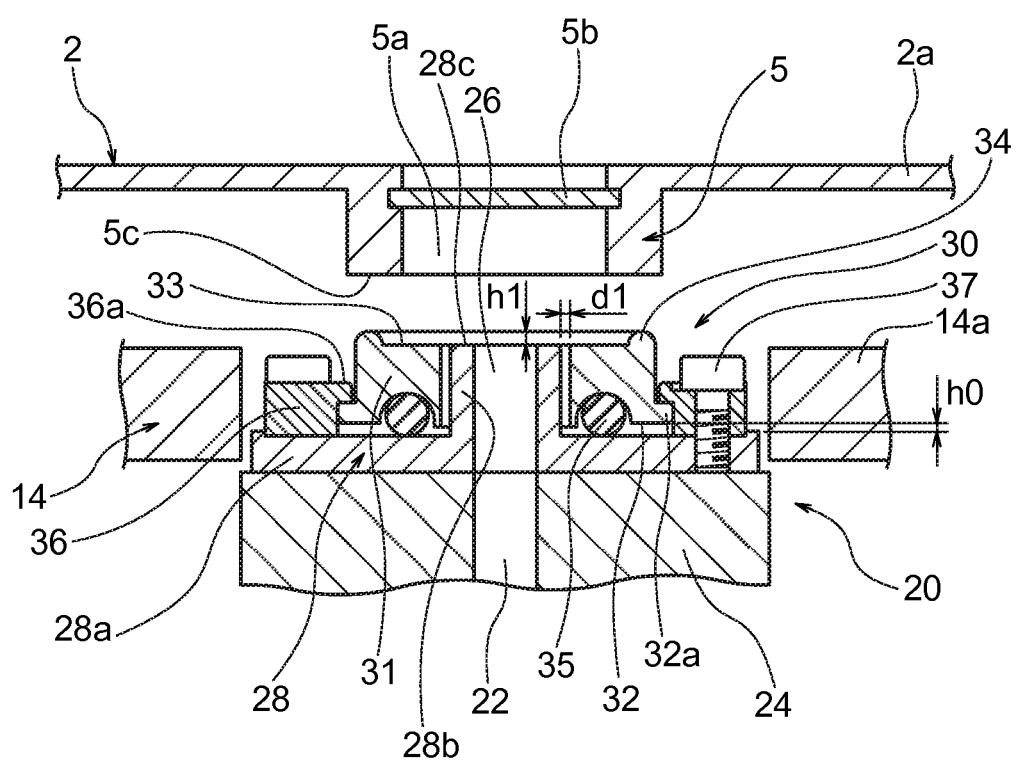
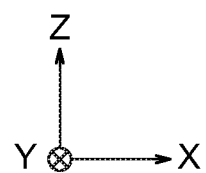

FIG. 4A
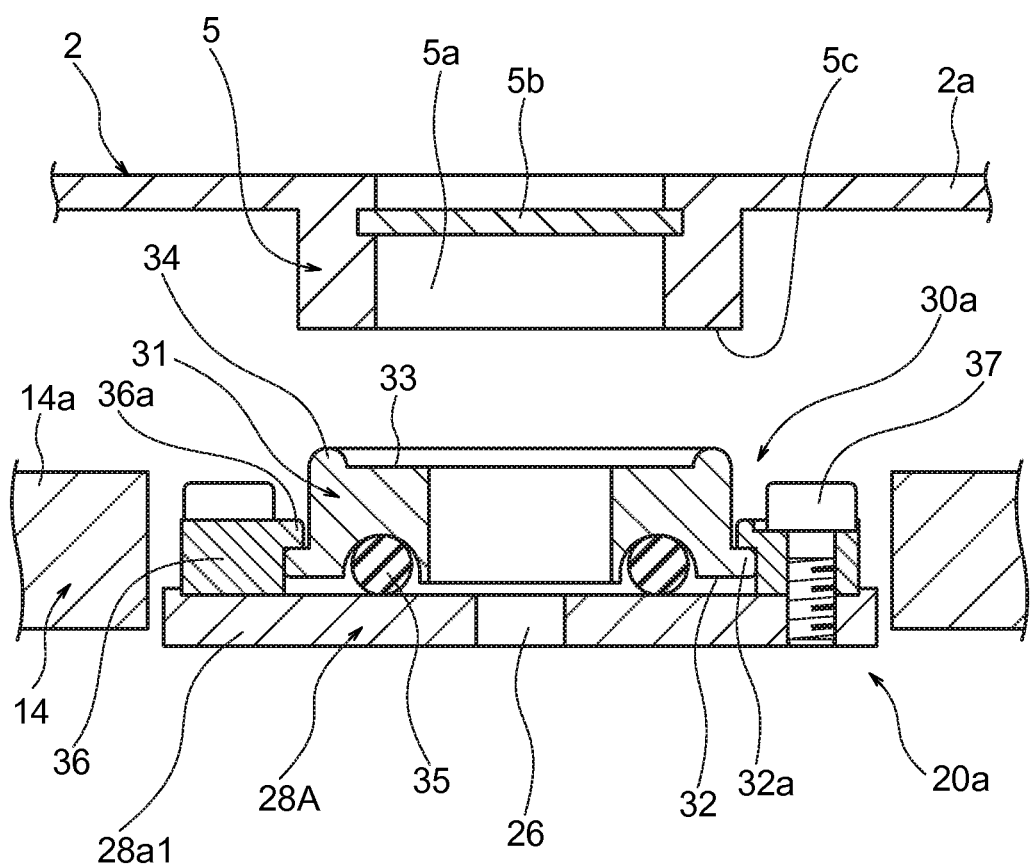
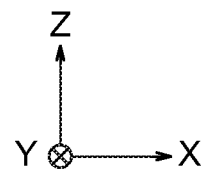

GAS PURGE UNIT, LOAD PORT APPARATUS, AND INSTALLATION STAND FOR PURGING CONTAINER

CROSS-REFERENCE TO RELATED APPLICATION

This application claims the priority of Japanese Patent Application No. 2014-162601, filed Aug. 8, 2014. The disclosure of the priority application is incorporated in its entirety herein by reference.

BACKGROUND OF THE INVENTION

1. Field of the Invention

The present invention relates to a gas purge unit, a load port apparatus, and an installation stand for a purging container.

2. Description of the Related Art

For example, in the semiconductor manufacturing process, there is a technique for cleaning an interior atmosphere of a wafer transport container by arranging gas intake nozzles on an installation stand for a load port apparatus, contacting the intake nozzles to gas intake ports provided on a bottom surface of the wafer transport container, and introducing a purge gas (bottom purge).

In the technique, there is a risk that positional variation and inclination of the gas intake ports cause a positional displacement between the gas intake nozzles and the gas intake ports. Such a clearance arises a problem that an inert gas supplied from the gas intake nozzles is leaked or that outside air is mixed into the wafer transport container via the gas.

In order to solve such a problem, a system that a nozzle body or a tip portion of a nozzle is pivoted (Patent Document 1 and Patent Document 2) is disclosed. The system employs a structure of pivoting a nozzle member itself with a nozzle opening or a part thereof. Thus, the nozzle structure is limited to be smaller.

In the conventional technique, a portion where elastic members are rubbed is necessary to pivot the nozzle member itself with the nozzle opening or a part thereof and to ensure sealabilty. Thus, there is a risk that rubbing chips (particles) caused by friction at the rubbed portion circulate into the wafer transport container through a flow passage.

In the conventional technique, there is also a risk that when even a little deposition is caused to the rubbed portion, the pivoting portion is clogged, following capability is hindered, and a clearance between a tip of a nozzle and an intake port is formed.

[Patent Document 1] JP Patent Application Laid Open No. 2012-164948

[Patent Document 2] JP Patent Application Laid Open No. 2014-36185

SUMMARY OF THE INVENTION

The present invention is accomplished in view of such situation, and its object is to provide a gas purge unit, a load port apparatus, and an installation stand for a purging container, which are excellent in seal performance between a circulating opening and a nozzle opening and are capable of filling inside of the purging container with cleaning gas without mixing particles or so.

In order to achieve the above object, a gas purge unit according to the first perspective of the present invention is a gas purge unit for circulating a cleaning gas through a circulating port into a purging container having the circulating port with a circulating opening, comprising:

a nozzle member with a cylindrical projection having a nozzle opening for circulating the cleaning gas;

a pivotable body arranged in a ring shape to surround the cylindrical projection and provided with a contact part formed on a tip portion of the pivotable body to be able to detachably contact with the circulating port; and a ring-shaped first pivot support portion held to be compressively elastically deformable along a longitudinal direction of the cylindrical projection between a rear end of the pivotable body and a base portion of the nozzle member.

In the gas purge unit according to the first perspective of the present invention, the circulating port (intake port or exhaust port, in the same hereinafter) of the purging container is detachably contacted with the contact part, which is formed at the tip portion of the pivotable body provided around the cylindrical projection of the nozzle member. The pivotable body with the contact part is supported by the ring-shaped first pivot support portion, and it compressively elastically deforms along the longitudinal direction of the cylindrical projection. Then, the pivotable body can pivot.

Thus, even when the circulating port is displaced positionally or inclined due to positional displacement or inclination of the purging container, the first pivot support portion compressively elastically deforms, which makes the pivotable body pivot in accordance with positional displacement or inclination of the purging container. As a result, the contact part formed at the tip portion of the pivotable body is closely contacted with the circulating port around the circulating opening (intake opening or exhaust opening, in the same hereinafter). The ring-shaped first pivot support portion is arranged to be elastically deformable between the rear end of the pivotable body and the base portion of the nozzle member, and functions as a seal member. Thus, the seal performance therebetween is maintained. Therefore, the pivotable body can satisfactorily seal the nozzle opening and the circulating opening isolated from outside air, and they can be airtightly connected.

Thus, the cleaning gas supplied (or exhausted, in the same hereinafter) from the nozzle opening can circulate from the circulating opening into (or exhausted, in the same hereinafter) the purging container without leaking to outside or mixing outside air thereinto. Then, the inside thereof can be satisfactorily filled with the gas and maintained in a clean condition.

Note that, the first pivot support portion just compressively elastically deforms between the rear end of the pivotable body and the base portion of the nozzle member, and is then hardly rubbed. Thus, particles or so due to rubbing hardly occur. Further, since the compressive and elastic deformation of the first pivot support portion enables the pivotable body to pivot, the pivotable portion moves smoothly, following capability is excellent, and a clearance between a tip of a nozzle member and an intake port hardly occurs.

Further, since the nozzle opening of the nozzle member, a movable portion (pivotable body), and a position adjusting portion (first pivot support portion) are independently constituted, the nozzle itself is not inclined and lowering of movability caused by a deposition on the nozzle hardly occurs, so that the seal performance does not deteriorate. In addition, the nozzle itself is not inclined, which makes it easier to supply the cleaning gas thereto. Further, since an elastically deformable portion is necessary to be formed in a artial position, the nozzle can be made smaller as a whole.

Since the pivotable body is arranged in a ring shape to surround the cylindrical projection, the nozzle opening and the pivotable body are positioned in the self-alignment manner. The nozzle opening is formed at the tip of the cylindrical projection, which makes a distance between the first pivot support portion and the nozzle opening larger. As a result, there is little risk that particles possibly caused by the first pivot support portion are mixed from the nozzle opening into the purging container.

The contact part may be arranged to protrude toward the purging container more than a tip of the cylindrical projection. By arranging the contact part in this way, it is possible to effectively prevent the tip of the nozzle member (tip of the cylindrical projection) from impacting on the circulating port. Note that, when the tip of the nozzle member goes into the circulating opening without impacting on the circulating port, the contact part may not be arranged to protrude toward the purging container more than the tip of the cylindrical projection.

The gas purge unit according to the first perspective of the present invention may further comprise a ring-shaped second pivot support portion held to be compressively elastically deformable along a direction vertical to the longitudinal direction of the cylindrical projection between an inner circumferential portion of the pivotable body and an outer circumferential portion of the cylindrical projection. In this case, the first and second pivot support portions function as two seal members, and seal performance between the nozzle member and the pivotable body can be further improved. In addition, the second pivot support portion is provided, so that it is possible to effectively prevent the inner circumferential surface of the pivotable body from impacting on the outer circumferential surface of the cylindrical projection even if the pivotable body pivots.

The gas purge unit according to the first perspective of the present invention may further comprise a stopper member for restricting the pivotable body to moving from the base portion of the nozzle member toward the circulating port, wherein the stopper member does not restrict the pivotable body to moving toward the base portion. In that case, when the nozzle member is detached from the circulating port, the pivotable body is forced to be detached from the circulating port along with the nozzle member, so that it is possible to effectively prevent the contact part of the pivotable body from adhering to the intake port.

A gas purge unit according to the second perspective of the present invention is a gas purge unit for circulating a cleaning gas through a circulating port into a purging container having the circulating port with a circulating opening, comprising:

a nozzle member with a nozzle opening for circulating the cleaning gas;

a pivotable body arranged in a ring shape to surround the nozzle opening and provided with a contact part capable of detachably contacting with the circulating port;

a ring-shaped pivot support portion held to be compressively elastically deformable between a rear end of the pivotable body and a base portion of the nozzle member; and a stopper member for restricting the pivotable body to moving from the base portion of the nozzle member toward the circulating port, wherein the stopper member does not restrict the pivotable body to moving toward the base portion.

In the gas purge unit according to the second perspective of the present invention, the circulating port of the purging container is detachably contacted with the contact part formed at the tip portion of the pivotable body. The pivotable body with the contact part is supported by the ring-shaped pivot support portion, and it deforms compressively elastically. Then, the pivotable body pivots.

Thus, even when the circulating port is displaced positionally or inclined due to positional displacement or inclination of the purging container, the pivot support portion compressively elastically deforms, which makes the pivotable body pivot in accordance with positional displacement or inclination of the purging container. As a result, the contact part formed at the tip portion of the pivotable body is closely contacted with the circulating port around the circulating opening. The ring-shaped pivot support portion is arranged to be elastically deformable between the rear end of the pivotable body and the base portion of the nozzle member, and functions as a seal member. Thus, the seal performance therebetween is maintained. Therefore, the pivotable body can satisfactorily seal the nozzle opening and the circulating opening isolated from outside air, and they can be airtightly connected.

Thus, the cleaning gas supplied from the nozzle opening can circulate from the circulating opening into the purging container without leaking to outside or mixing outside air thereinto. Then, the inside thereof can be satisfactorily filled with the gas and maintained in a clean condition.

Note that, the pivot support portion just compressively elastically deforms between the rear end of the pivotable body and the base portion of the nozzle member, and is then hardly rubbed. Thus, particles or so due to rubbing hardly occur. Further, since the compressive and elastic deformation of the pivot support portion enables the pivotable body to pivot, the pivotable portion moves smoothly, following capability is excellent, and a clearance between a tip of a nozzle member and an intake port is hardly formed.

Further, since the nozzle opening of the nozzle member, a movable portion (pivotable body), and a position adjusting portion (pivot support portion) are independently constituted, the nozzle itself is not inclined and lowering of movability caused by a deposition on the nozzle hardly occurs, so that the seal performance does not deteriorate. In addition, the nozzle itself is not inclined, which makes it easier to supply the cleaning gas thereto. Further, since an elastically deformable portion is necessary to be formed in a partial position, the nozzle can be made smaller as a whole.

The gas purge unit according to the second perspective of the present invention comprises a stopper member for restricting the pivotable body to moving from the base portion of the nozzle member toward the circulating port, wherein the stopper member does not restrict the pivotable body to moving toward the base portion. Thus, when the nozzle member is detached from the circulating port, the pivotable body is forced to be detached from the circulating port along with the nozzle member, so that it is possible to effectively prevent the contact part of the pivotable body from adhering to the intake port. Further, the stopper member also has a function of aligning the pivotable body and the nozzle opening of the nozzle member.

The contact part may be harder than a contact surface of an intake port on which the contact part contacts. By having such a structure, the contact part itself does not deform even if it is contacted with the intake port for a long time, and the contact part can be more effectively prevented from adhering to the intake port. Further, it is possible to prevent the contact part from being worn and to prevent particles from being made. In addition, malfunction due to dust does not occur.

The contact part may be a ring-shaped convex formed at the tip portion of the pivotable body. The contact part may be a tapered slope formed at the tip portion of the pivotable body.

A load port apparatus of the present invention comprises the gas purge unit mentioned above. An installation stand for a purging container of the present invention comprises the gas purge unit mentioned above. The gas purge unit of the present invention may be provided with other devices or places.

BRIEF DESCRIPTION OF THE DRAWINGS

FIG. 3A is a detailed cross sectional view of a main part of the gas purge unit shown in FIG. 2, and shows that an intake port and an intake nozzle are separated.

FIG. 4A is a cross sectional view of a main part of a pivotable seal device used for a gas purge unit according to other embodiment of the present invention.

DESCRIPTION OF THE PREFERRED EMBODIMENTS

Hereinafter, the present invention will be described based on embodiments shown in the figures.

First Embodiment

Figure 1:
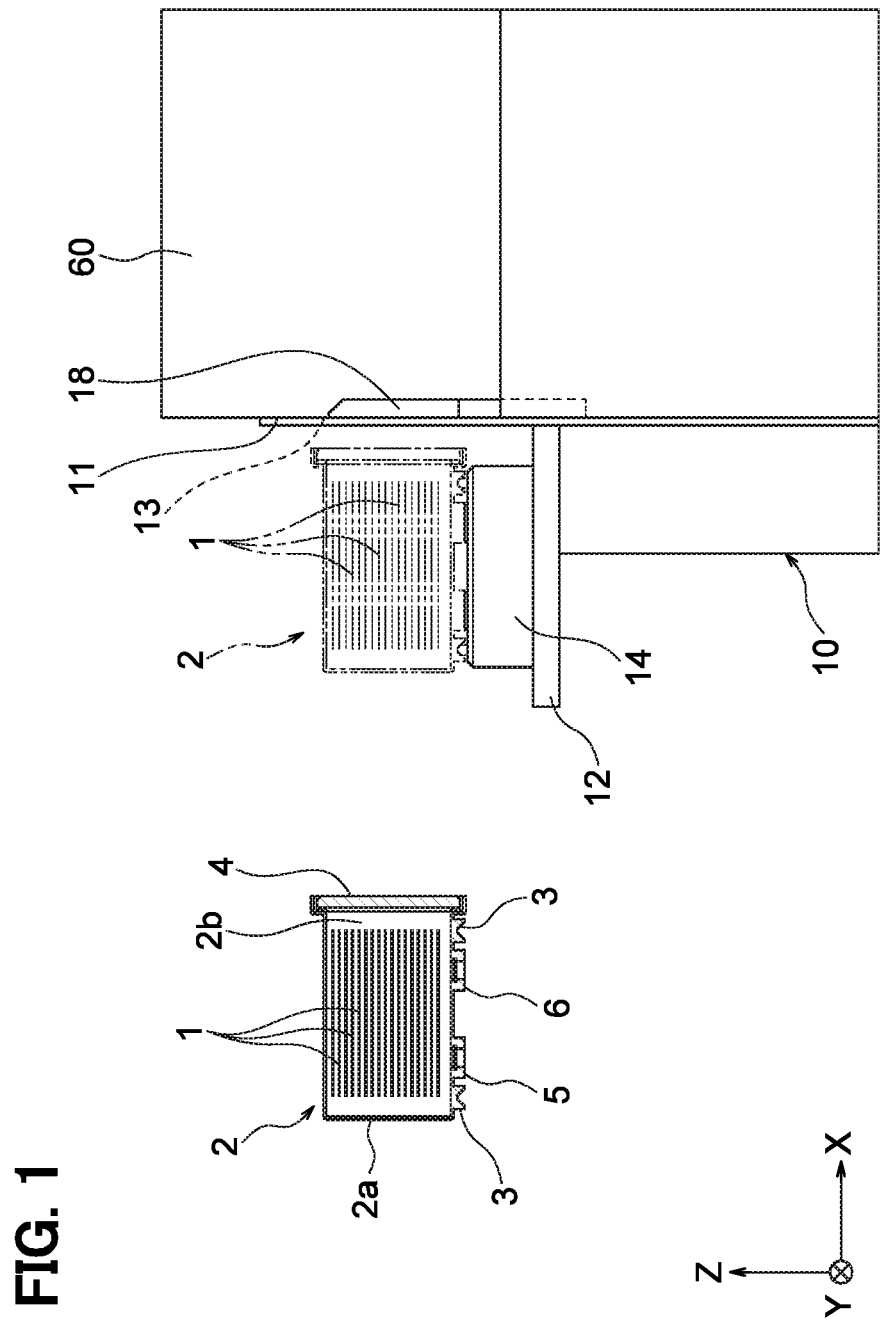
FIG. 1 is a schematic view of a load port apparatus to which a gas purge unit according to one embodiment of the present invention is applied.

As shown in FIG. 1, a load port apparatus 10 according to one embodiment of the present invention is connected to a semiconductor processing apparatus 60. The load port apparatus 10 has an installation stand 12 and a movable table 14. The movable table 14 is movable on the installation stand 12 in the X-axis direction. Note that, in the figures, the X-axis represents a moving direction of the movable table 14, the Z-axis represents a vertical direction, and the Y-axis represents a direction vertical to the X-axis and the Z-axis.

A sealed transport container 2 can be detachably placed on a top of the movable table 14 in the Z-axis direction. The sealed transport container 2 is comprised of a pot or a FOUP etc. for transporting a plurality of wafers 1 while they are sealed and stored, and has a casing 2a. A space for housing the wafers 1 to be processed is formed inside of the casing 2a. The casing 2a has an approximately box-like shape with an opening on one of surfaces present in the horizontal direction.

The sealed transport container 2 also has a lid 4 for sealing an opening 2b of the casing 2a. Shelves (not shown) with multiple stages for holding the wafers 1 horizontally to be vertically overlapped are arranged inside of the casing 2a. The wafers 1 placed on the shelves are respectively housed inside of the container 2 at regular intervals.

The load port apparatus 10 is an interface device for transporting wafers housed in a sealed state in the sealed transport container 2 into the semiconductor processing apparatus 60 while maintaining a clean condition. The load port apparatus 10 has a door 18 for opening and closing an exchanging opening 13 of a wall member 11. The wall member 11 functions as a part of a casing for sealing inside of the semiconductor processing apparatus 60 in a clean condition, or as a part of a casing for sealing inside of an apparatus such as EFEM connecting the semiconductor processing apparatus 60 and the load port apparatus 10 in a clean condition. FIG. 5A to FIG. 5D will briefly explain how the door 18 moves.

Figure 5A:
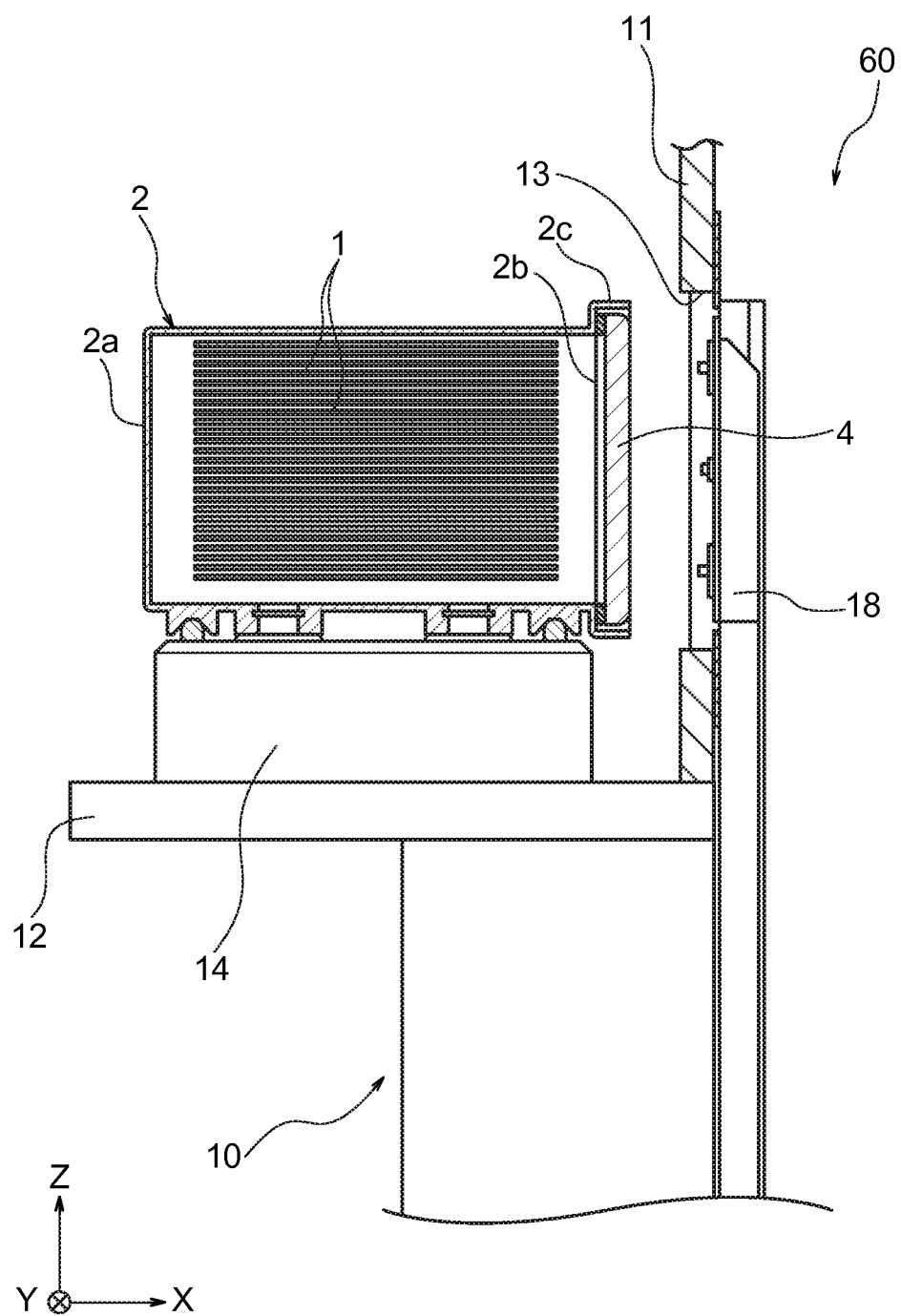
FIG. 5A is a schematic view showing a step for opening a door of a FOUP by a load port apparatus.
Figure 5B:
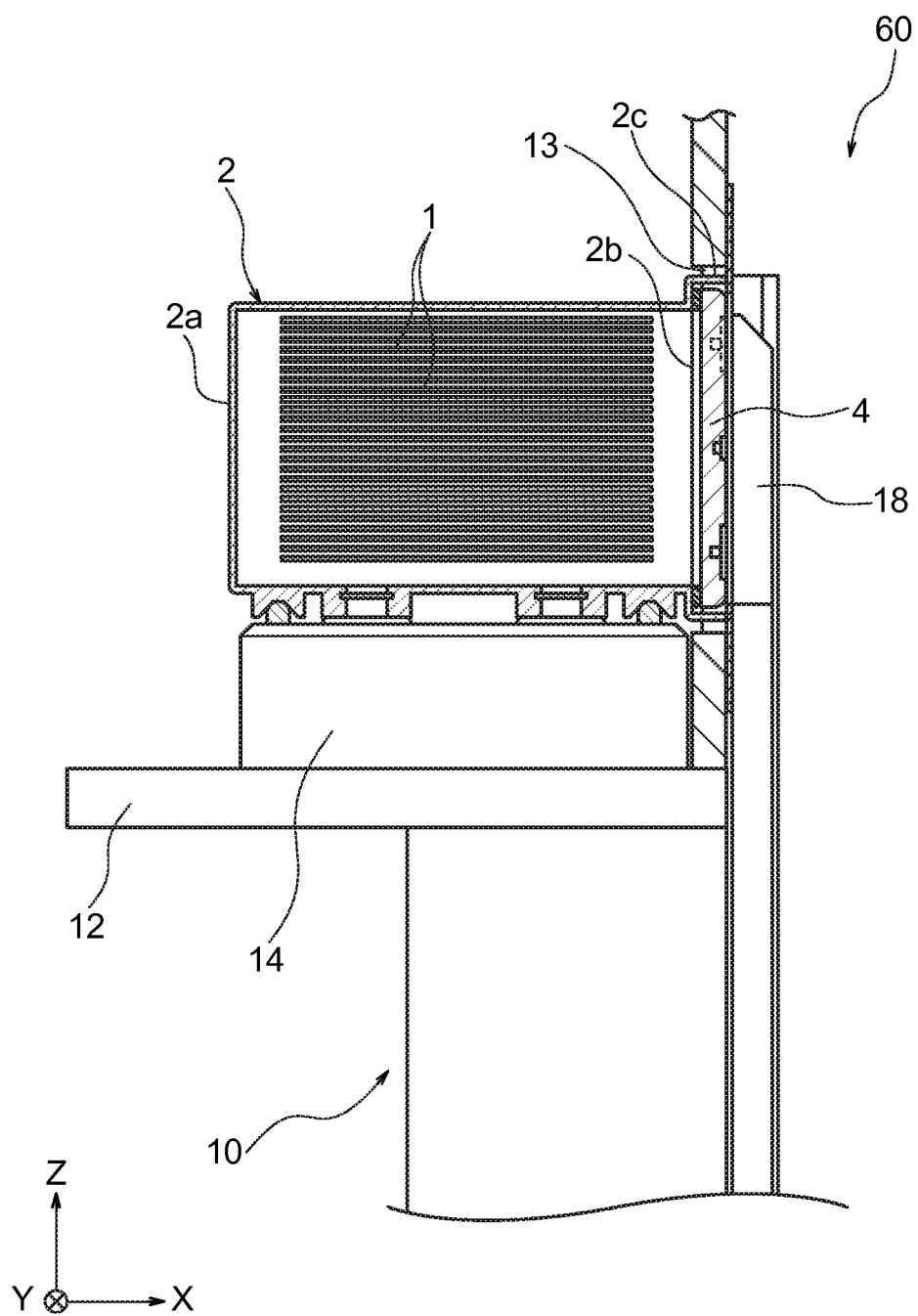
FIG. 5B is a schematic view showing a continuous step from FIG. 5A.

As shown in FIG. 5A, after the container 2 is placed on the table 14, bottom gas purge mentioned below is performed. As shown in FIG. 5B, under a condition that the bottom gas purge is being performed, the table 14 moves in the X-axis direction, and opening edges 2c, where the lid 4 airtightly sealing the opening 2b of the container 2 is attached, go into the exchanging opening 13 of the wall member 11.

Figure 5C:
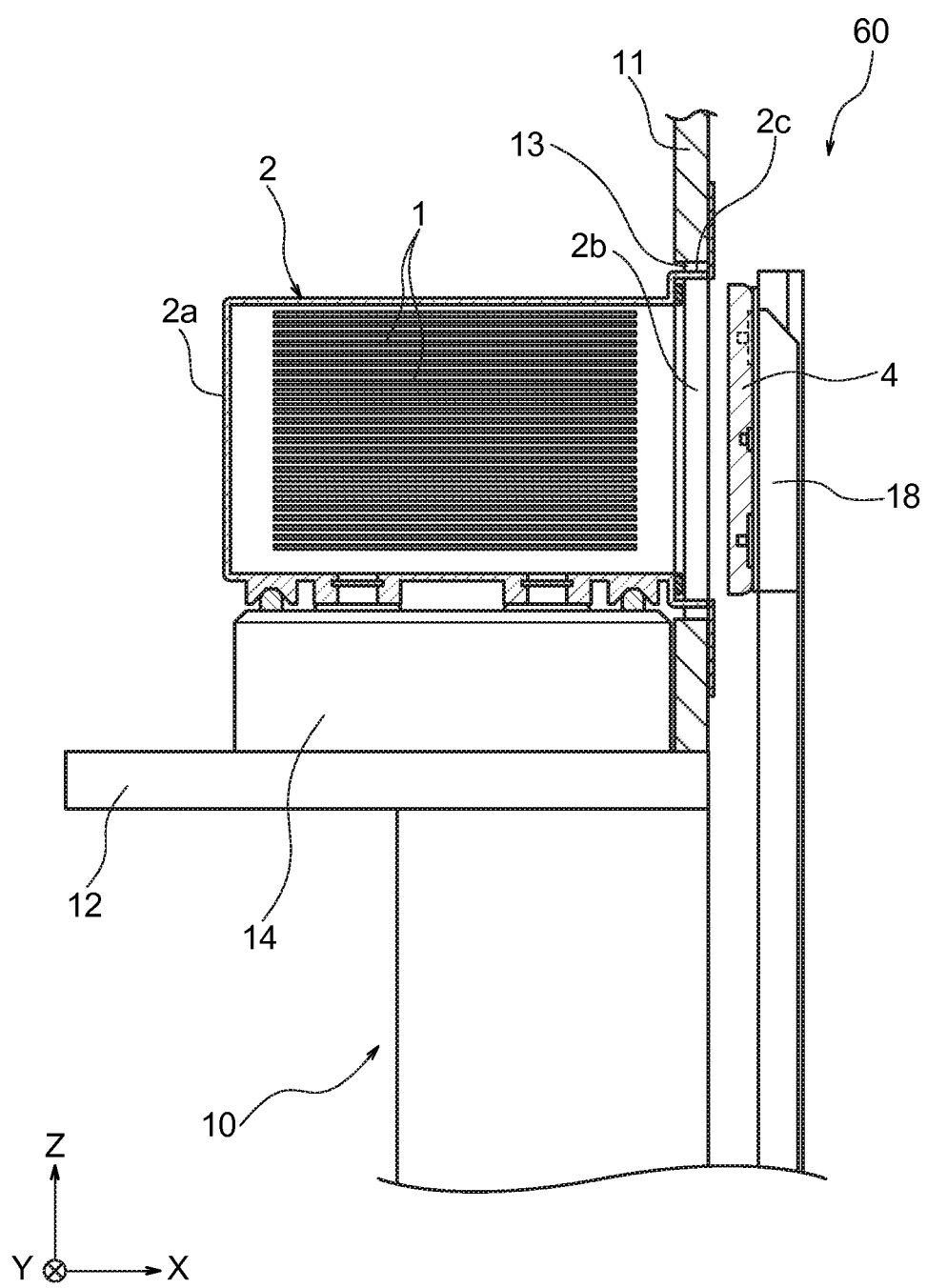
FIG. 5C is a schematic view showing a continuous step from FIG. 5B.

At the same time, the door 18 located inside of the wall 11 (opposite side to the table 14) is engaged with the lid 4 of the container 2. At that time, a space between the opening edges 2c and opening edges of the exchanging opening 13 is sealed by such as a gasket, and the space is sealed in a good condition. Thereafter, as shown in FIG. 5C, inside of the container 2 and inside of the wall 11 are connected by moving the door 18 together with the lid 4 in parallel along the X-axis direction or moving them rotationally, detaching the lid 4 from the opening edges 2c, and opening the opening edges 2c. At that time, the bottom gas purge may be continuously operated, or in addition to the bottom purge, purge gas (cleaning gas) such as nitrogen gas or other inert gas may be flowed out (front purge) from the inside of the wall 11 to the inside of the container 2.

Figure 5D:
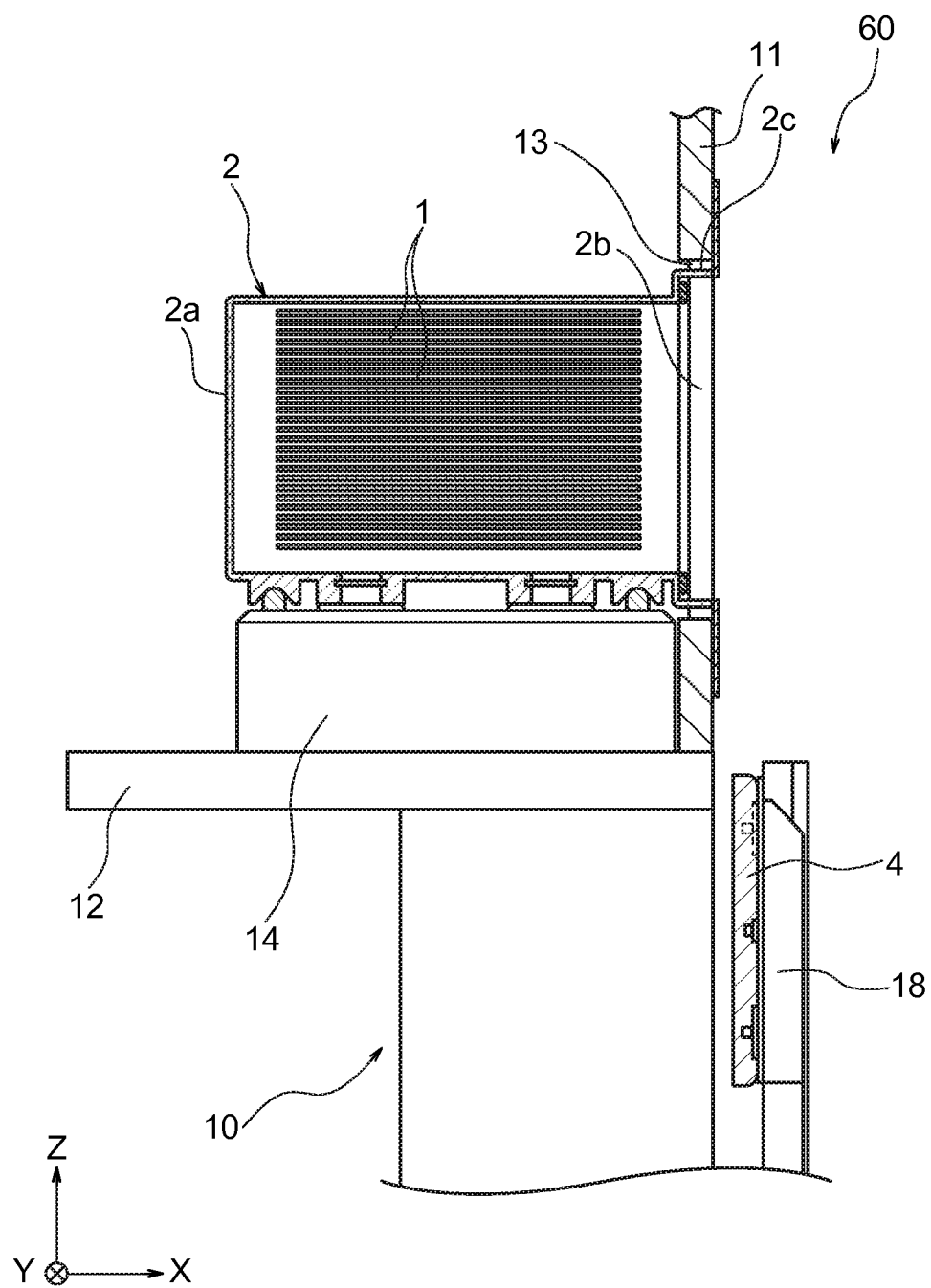
FIG. 5D is a schematic view showing a continuous step from FIG. 5C.

Next, as shown in FIG. 5D, when the door 18 is moved downward in the Z-axis in the wall 11, the opening 2b of the container 2 completely opens to the inside of the wall 11, and the wafers 1 are exchanged into the wall 11 via the opening 2b by such as a robot hand arranged inside of the wall 11. At that time, the inside of the container 2 and the inside of the wall 11 may be cut off from outside air, and bottom purge and/or front purge may be continuously operated. As a result, the inside of the container 2 is maintained in a clean environment. An operation opposite to the above may be carried out to return the wafers 1 to the inside of the container 2 and to detach it from the table 14.

Figure 2:
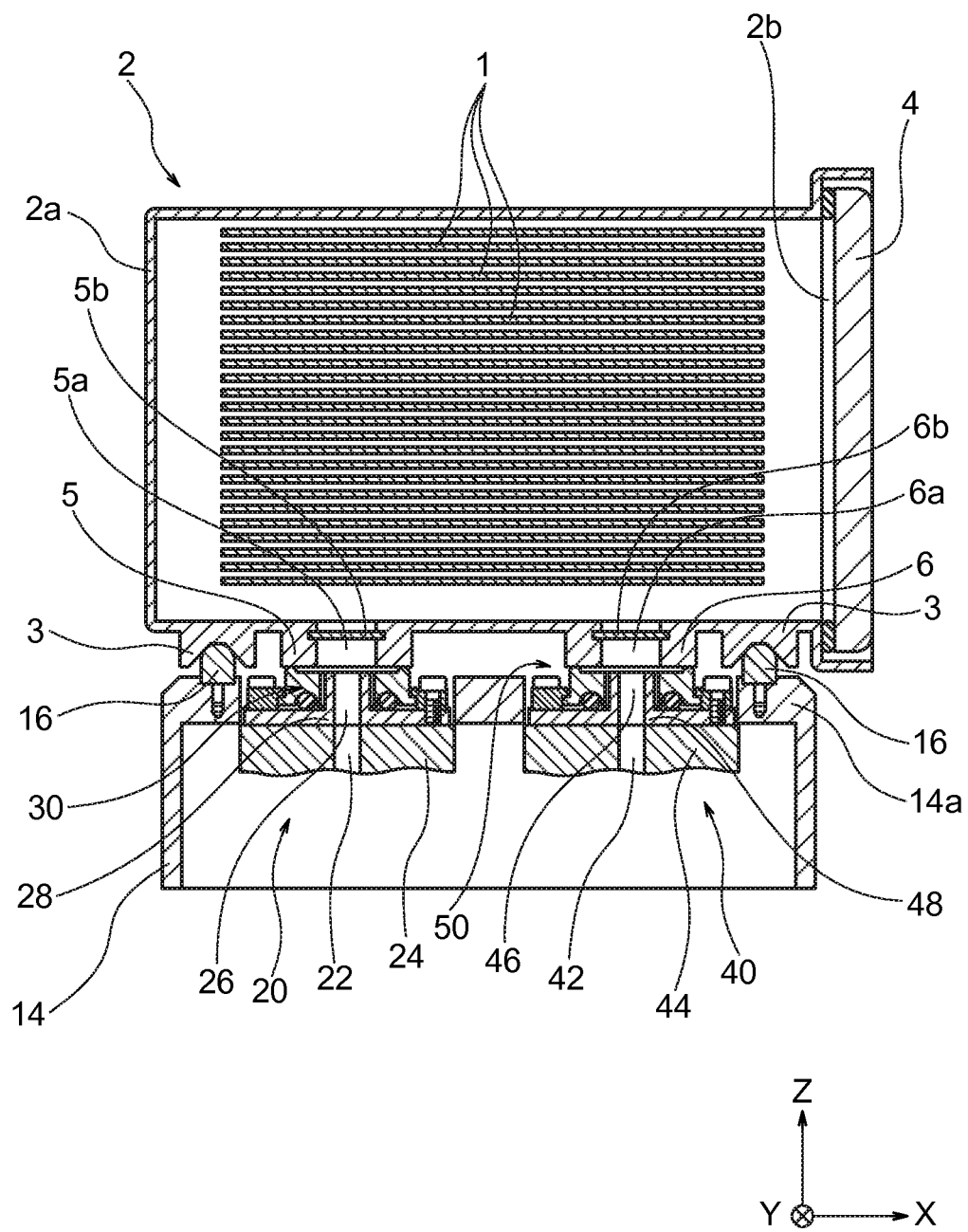
FIG. 2 is a cross sectional view showing a relation between the gas purge unit assembled in the load port apparatus shown in FIG. 1 and a FOUP as a purging container.

As shown in FIG. 2, one or more positioning pins 16 are embedded in a top surface 14a of the movable table 14, and the positioning pins 16 are engaged with concaves of positioning portions 3 provided with a bottom surface of the casing 2a. Then, a positional relation between the container 2 and the movable table 14 is determined nonambiguously.

When the wafers 1 are being stored or transferred, the inside of the sealed transport container 2 is sealed, and the surroundings of the wafers 1 are maintained in a clean environment. When the sealed transport container 2 is positioned and placed on the top surface 14a of the movable table 14, the intake port 5 and the exhaust port 6, which are formed on the bottom surface of the sealed transport container 2, are respectively airtightly connected to an intake pivotable seal device 30 of an intake gas purge unit 20 and to an exhaust pivotable seal device 50 of an exhaust gas purge unit 40. In the present embodiment, a bottom gas purge treatment is carried out inside of the container 2 by the intake gas purge unit 20 and the exhaust gas purge unit 40. Note that, in the figures, the intake port 5, the exhaust port 6, the intake gas purge unit 20, the exhaust gas purge unit 40 and the like are enlarged for easy understanding compared with the sealed transport container 2, but they are different from actual dimension ratio.

The intake port 5 and the exhaust port 6 are respectively provided with an intake opening 5a and an exhaust opening 6a, and they can be connected to inside of the casing 2a via check valves 5b and 6b. The check valve 5b, which is provided in the middle of the intake opening 5a, permits an inflow of a cleaning gas attempting to go into the casing 2a via the intake opening 5a with a predetermined pressure or higher. However, the check valve 5b does not permit an outflow opposite thereto.

The check valve 6b, which is provided in the way of the exhaust opening 6a, permits an outflow of a cleaning gas attempting to go outside from the casing 2a via the exhaust opening 6a with a predetermined pressure or higher. However, the check valve 6b does not permit an inflow opposite thereto. By providing the valves 5b and 6b, the inside of the container 2 is not connected to outside air via the intake opening 5a or the exhaust opening 6a during transportation or storage of the container 2 as long as the gas purge unit 20 or 40 is connected to the intake port 5 or the exhaust port 6.

As shown in FIG. 2, in the present embodiment, the intake gas purge unit 20 and the exhaust gas purge unit 40 have similar structures. The units 20 and 40 are housed inside of the movable table 14. Only heads of the pivotable seal devices 30 and 50 of the units 20 and 40 protrude upward in the Z-axis direction from the top surface 14a of the table 14.

The intake gas purge unit 20 has an intake member 24 provided with an intake passage 22 for providing a cleaning gas such as nitrogen gas or other inert gas. The intake member 24 is arranged inside of the table 14. An intake nozzle 28 provided with a nozzle opening 26 is airtightly connected onto the top of the intake member 24 in the Z-axis direction. Then, the nozzle opening 26 and the intake passage 22 are connected. The nozzle opening 26 is airtightly connected into the intake pivotable seal device 30.

The exhaust gas purge unit 40 has an exhaust member 44 provided with an exhaust passage 42 for exhausting a cleaning gas such as nitrogen gas or other inert gas. The exhaust member 44 is arranged inside of the table 14. An exhaust nozzle 48 provided with a nozzle opening 46 is airtightly connected onto the top of the exhaust member 44 in the Z-axis direction. Then, the nozzle opening 46 and the exhaust passage 42 are connected. The nozzle opening 46 is airtightly connected into the exhaust pivotable seal device 50.

In the present embodiment, the intake pivotable seal device 30 and the exhaust pivotable seal device 50 have the same structures. Thus, only the intake pivotable seal device 30 will be explained in detail, and the exhaust pivotable seal device 50 will not be explained.

As shown in FIG. 3A, the intake nozzle 28 as a nozzle member has a plate base portion 28a and a cylindrical projection 28b. The cylindrical projection 28b protrudes from the central part of the base portion 28a to upward in the Z-axis direction. The nozzle opening 26 is formed at an internal upper area of the cylindrical projection 28b. The intake pivotable seal device 30 has a pivotable body 31. The pivotable body 31 is arranged in a ring shape to surround the cylindrical projection 28b with a predetermined clearance d1 (one-side clearance), wherein a contact part 34 detachably capable of contacting with the intake port 5 is formed at an outer circumference of a tip portion 33 of the pivotable body 31. In the present embodiment, the contact part 34 has a cross section of semicircular convex and is arranged in a ring shape at the tip portion 33 of the pivotable body 31.

An O-ring groove is formed on a rear end 32 of the pivotable body 31, and an O-ring 35 is housed thereon as a first pivot support portion. The O-ring 35 is held to be compressively elastically deformable between the rear end 32 of the pivotable body 31 and the base portion 28a of the nozzle 28. The size of the O-ring groove is determined so that the O-ring 35 protrudes from the rear end 32 toward the base portion 28a.

A clearance h0 between the rear end 32 of the pivotable body 31 and the top surface of the base portion 28a is determined to allow the pivotable body 31 to pivot for the nozzle 28, and preferably absorbs an angle at which the intake port is inclined. The O-ring 35 compressively elastically deforms within the range of the clearance h0. A clearance d1 between an inner circumferential surface of the pivotable body 31 and an outer circumferential surface of the cylindrical projection 28b is as large as the clearance h0. However, they are not necessarily the same, and the clearance h1 may be larger than the clearance h0. Preferably, the clearance d1 is one where the intake nozzle 28 and the pivotable body 31 are not contacted.

A ring-shaped stopper member 36 is arranged on the outer circumference of the pivotable body 31 and is fixed to the base portion 28a of the nozzle 28 by a bolt 37 or so. An inner engagement piece 36a is continuously or intermittently formed along the circumferential direction on an inner circumferential upper edge of the stopper member 36. The inner engagement piece 36a is engaged with an outer engagement piece 32a, which is continuously or intermittently formed along the circumferential direction on an outer circumferential lower portion of the pivotable body 31.

As a result, the pivotable body 31 is not limited to move toward the base portion 28a, but is limited to move from the base portion 28a of the nozzle member 28 toward the intake port 5. That is, within the range of the predetermined clearance h0, the pivotable body 31 can pivot due to the elastic deformation of the O-ring 35. Note that, the stopper member 36 may be arranged intermittently along the circumferential direction.

In the present embodiment, the contact part 34 is arranged to protrude toward the container 2 more than a tip 28c of the cylindrical projection 28b with the predetermined height h1. By arranging the contact part 34 in this way, the tip 28c of the nozzle 28 can be effectively prevented from impacting on the intake port 5. Note that, when the tip of the nozzle 28 goes into the intake opening 5a without impacting on the intake port 5, the contact part 34 may not be arranged to protrude toward the container 2 more than the tip 28c of the cylindrical projection 28b.

The pivotable body 31 is preferably harder than the elastically deformable O-ring 35 and is also preferably hard not to be deformed even if the O-ring 35 is deformed when the contact part 34 contacts with the intake opening 5a. For example, the O-ring 35 is comprised of material which does not pass through gas and has enough thickness. The O-ring 35 is specifically comprised of such as rubber, soft plastic, or sponge.

The pivotable body 31 is made from a material having poor elasticity, large hardness, and a feature of preventing gas from passing through at an operating pressure. The pivotable body 31 is specifically comprised of metal such as aluminum, steel, copper, or titanium, but is not limited to be comprised thereof as long as it is comprised of a material having a large hardness. The pivotable body 31 may be comprised of such as plastic, glass, or rubber.

Note that, in the present embodiment, the contact part 34 is integrally formed with the pivotable body 31, but the contact part 34 and the pivotable body 31 can be comprised of different members. Both the contact part 34 and the pivotable body 31 are preferably comprised of a rigid material which is harder than the O-ring 35.

Figure 3B:
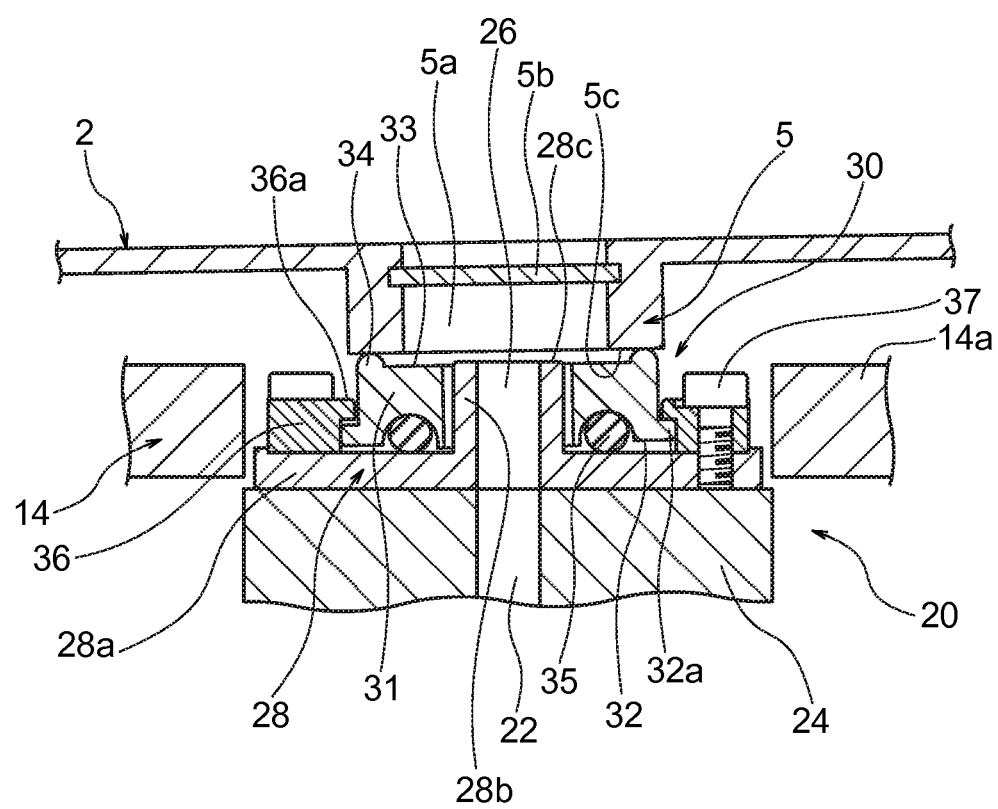
FIG. 3B is a detailed cross sectional view of a main part of the gas purge unit shown in FIG. 2, and shows that an intake port is mounted on an intake nozzle at an angle.

As shown in FIG. 3A and FIG. 3B, the convex of the contact part 34 protruding upward with semicircular cross section contacts with a contact bottom surface 5c surrounding the intake opening 5a of the intake port 5. A gasket sheet for sealing not shown may be mounted on the contact bottom surface 5c. The gasket sheet is elastic. The contact part 34 is harder than the contact bottom surface 5c of the intake port 5 contacting therewith.

As shown in FIG. 3B, the O-ring 35 is comprised of a compressively elastically deformable material such as rubber. Thus, even if the container 2 is placed to be inclined toward the table 14 to some degree, airtightness of the container 2 is maintained because the O-ring 35 elastically deforms, the pivotable body 31 pivots, and the convex with the semicircular cross section of the ring-shaped contact part 34 is closely contacted with the contact bottom surface 5c over the whole circumference.

When a purge gas is supplied to the intake passage 22 in a condition shown in FIG. 3B, an internal pressure of the nozzle opening 26 is heightened, the check valve 5b opens, and the purge gas is supplied from the nozzle opening 26 into the container 2 via the intake opening 5a. In the container 2, pressure is heightened by the purge gas, and the check valve 6b of the exhaust opening 6a shown in FIG. 2 opens. Then, the purge gas is exhausted via the exhaust opening 6a, the nozzle opening 46, and the exhaust passage 42. Thus, the container 2 is filled with a clean purge gas, which improves cleanliness of inside of the container 2.

In the gas purge units 20 and 40 of the present invention, the contact part 34, which is provided with the tip portion of the pivotable body 31 provided with the intake nozzle 28 (or the exhaust nozzle 48, in the same hereinafter), is detachably contacted with the intake port 5 (or the exhaust port 6, in the same hereinafter) of the container 2. The pivotable body 31 with the contact part 34 is supported by the ring-shaped O-ring 35, and the O-ring 35 deforms compressively elastically along the longitudinal direction of the cylindrical projection 28b. As a result, the pivotable body 31 pivots.

Thus, as shown in FIG. 3B, even when the intake port 5 is displaced positionally or inclined due to positional displacement or inclination of the container 2, the O-ring 35 compressively elastically deforms, which makes the pivotable body 31 pivot in accordance with positional displacement or inclination of the container 2. As a result, the contact part 34 formed at the tip portion 33 of the pivotable body 31 is closely contacted with the intake port 5 around the intake opening 5a (or the exhaust opening 6a, in the same hereinafter). The O-ring 35 is arranged to be elastically deformable between the rear end 32 of the pivotable body 31 and the base portion 28a of the nozzle 28, and functions as a seal member. Thus, the seal performance therebetween is maintained. Therefore, the pivotable body 31 can satisfactorily isolate and seal the nozzle opening 26 and the intake opening 5a from outside air, and they can be airtightly connected.

Thus, the purge gas supplied (or exhausted, in the same hereinafter) from the nozzle opening 26 can circulate (or exhaust, in the same hereinafter) into the container 2 from the intake opening 5a without leaking to outside or mixing outside air thereinto, satisfactorily fill inside thereof with the purge gas, and maintain the inside in a clean condition.

Note that, the O-ring 35 just compressively elastically deforms between the rear end 32 of the pivotable body 31 and the base portion 28a of the nozzle 28, and is then hardly rubbed. Thus, particles or so due to rubbing hardly occur. Further, since the O-ring 35 enables the pivotable body 31 to pivot by just deforming compressively elastically, the pivotable portion moves smoothly, following capability is excellent, and a clearance between the nozzle 28 and the intake port 5 is hardly formed.

Further, in the present embodiment, since the nozzle 28 with the nozzle opening 26, the movable portion (pivotable body 31), and a position adjusting portion (O-ring 35) are independently constituted, the nozzle 28 itself is not inclined and the seal performance does not deteriorate without lowering of movability caused by a deposition on the nozzle 28. In addition, the nozzle 28 itself is not inclined, which makes it easier to supply the cleaning gas thereto. Further, since an elastically deformable portion is necessary to be formed in a partial position, the nozzle 28 can be made smaller as a whole.

In the present embodiment, the pivotable body 31 is arranged in a ring shape to surround the cylindrical projection 28b, and the nozzle opening 26 is formed at the tip of the cylindrical projection 28b. Thus, a distance between the O-ring 35 and the nozzle opening 26 is made larger, and there is little risk that particles possibly caused by the O-ring 35 are mixed from the nozzle opening 26 into the container 2.

Further, in the present embodiment, the gas purge unit has the stopper member 36. Thus, when the nozzle 28 is detached from the intake port 5, the pivotable body 31 is forced to be detached from the intake port 5 along with the nozzle 28, so that it is possible to effectively prevent the contact part 34 of the pivotable body 31 from adhering to the intake port 5. Further, the stopper member 36 also has a function of aligning the pivotable body 31 and the nozzle opening 26 of the nozzle 28.

The contact part 34 is harder than a contact surface of the intake port 5 on which the contact part 34 contacts. By having such a structure, the contact part 34 itself does not deform even if it is contacted with the intake port 5 for a long time, and the contact part 34 can be more effectively prevented from adhering to the intake port 5. Further, it is possible to prevent the contact part 5 from being worn and to prevent particles from being made. In addition, malfunction due to dust does not occur.

Second Embodiment

FIG. 4A is a cross sectional view of a main part of a pivotable seal device 30a used for a gas purge unit 20a according to other embodiment of the present invention. The pivotable seal device 30a is used for either or both of intake and exhaust. Except for the following, the second embodiment has structures similar to the first embodiment mentioned above and demonstrates similar effects.

As shown in FIG. 4A, in this embodiment, a nozzle opening 26 is directly formed in a base portion 28a1 of an intake nozzle 28A, and the cylindrical projection 28b mentioned in the first embodiment is not present. Other structures are similar to the first embodiment mentioned above.

In this embodiment, an inner circumferential surface of a pivotable body 31 serves as a part of the nozzle opening 26. In the present embodiment, since the cylindrical projection 28b is not present, structures become simpler than the first embodiment. Other effects of the present embodiment are similar to the first embodiment except that effects demonstrated by having the cylindrical projection 28b of the first embodiment are not obtained.

Third Embodiment

Figure 4B:
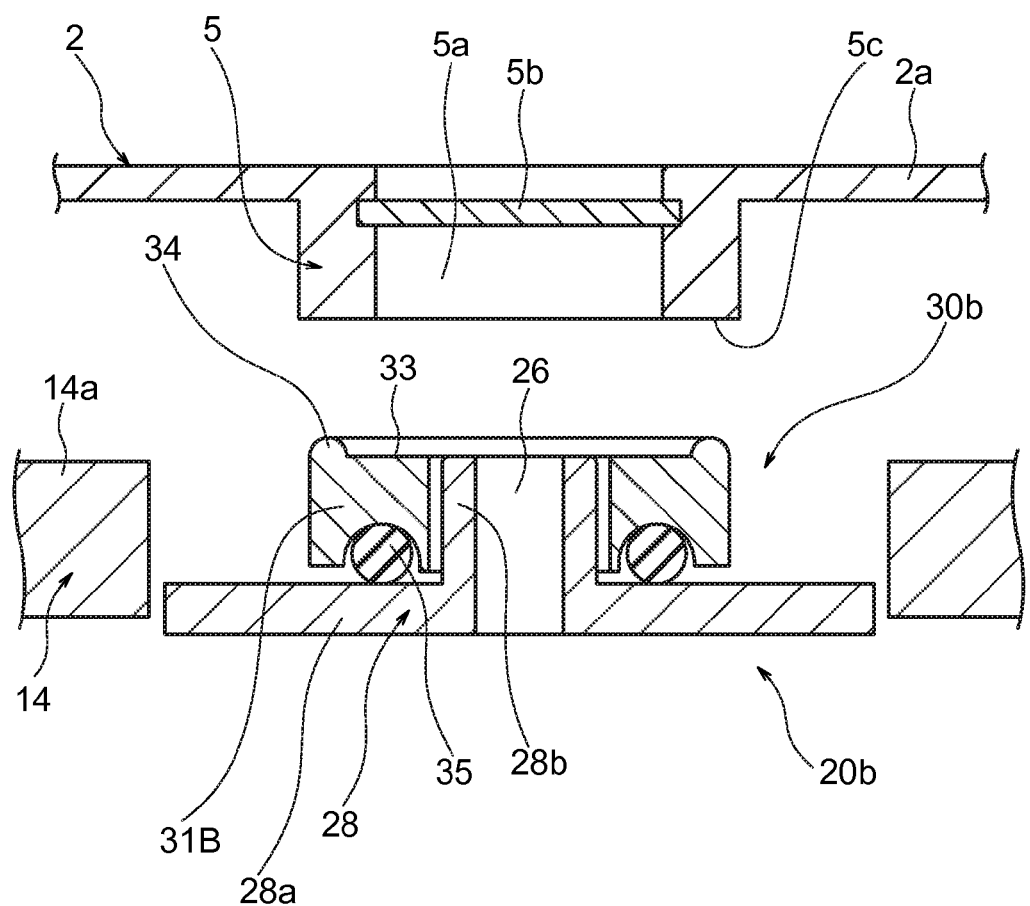
FIG. 4B is a cross sectional view of a main part of a pivotable seal device used for a gas purge unit according to further other embodiment of the present invention.

FIG. 4B is a cross sectional view of a main part of a pivotable seal device 30b used for a gas purge unit 20b according to further other embodiment of the present invention. The pivotable seal device 30b is used for either or both of intake and exhaust. Except for the following, the third embodiment has structures similar to the first embodiment mentioned above and demonstrates similar effects.

As shown in FIG. 4B, this embodiment has structures similar to the first embodiment mentioned above except that the stopper member 36 of the first embodiment is not present. That is, in this embodiment, the stopper member 36 of the first embodiment is not provided with an outer circumference of a pivotable member 31B.

In this embodiment, a pivotable body 31 is arranged in a ring shape to surround a cylindrical projection 28b. Thus, a nozzle opening 26 and the pivotable body 31 are positioned in the self-alignment manner even if the stopper member 36 is not present. In the present embodiment, since the stopper member 36 is not present, structures become simpler than the first embodiment. Other effects of the present embodiment are similar to the first embodiment except that effects demonstrated by having the stopper member 36 of the first embodiment are not obtained.

Fourth Embodiment

Figure 4C:
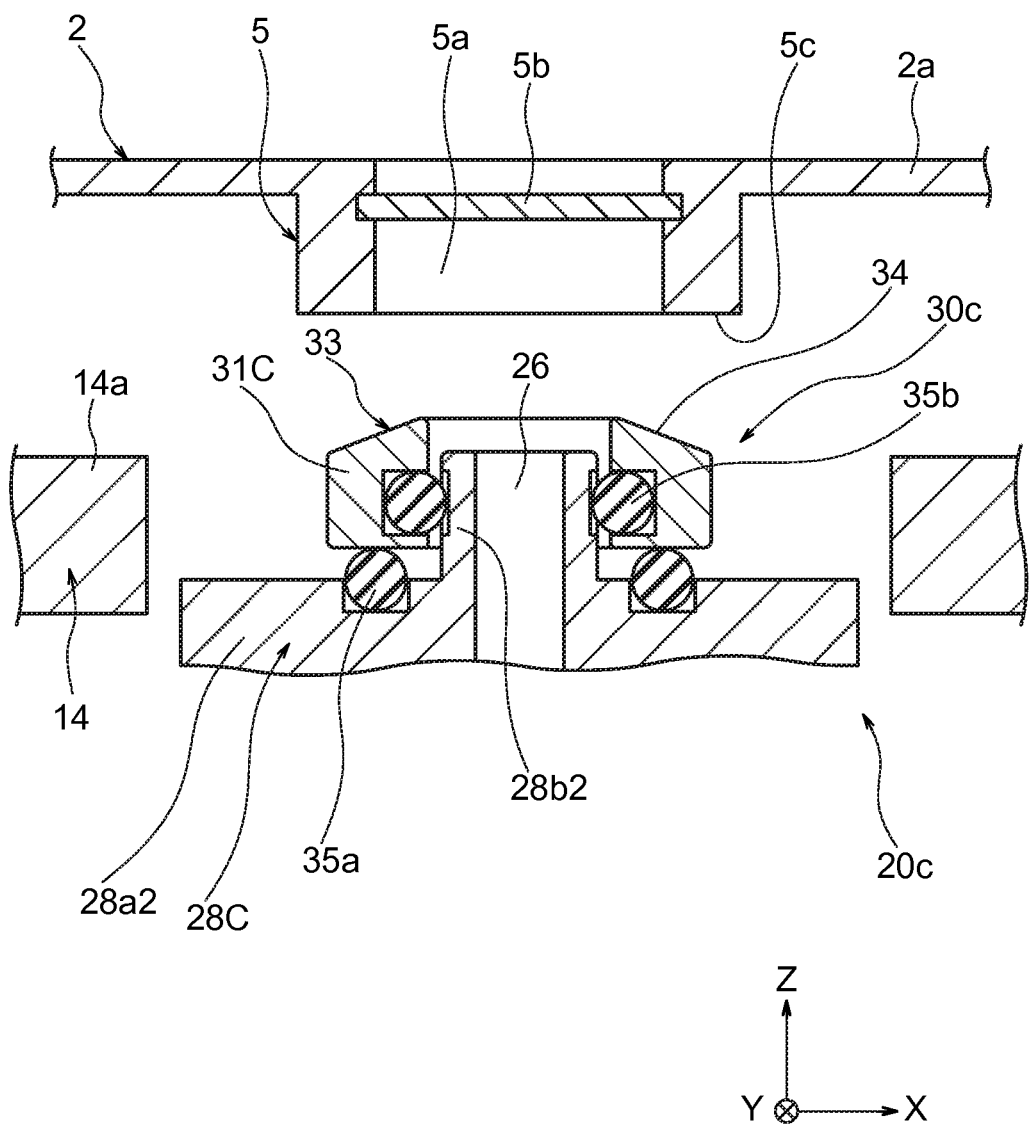
FIG. 4C is a cross sectional view of a main part of a pivotable seal device used for a gas purge unit according to further other embodiment of the present invention.

FIG. 4C is a cross sectional view of a main part of a pivotable seal device 30c used for a gas purge unit 20c according to further other embodiment of the present invention. The pivotable seal device 30c is used for either or both of intake and exhaust. Except for the following, the fourth embodiment has structures similar to the third embodiment mentioned above and demonstrates similar effects.

As shown in FIG. 4C, the pivotable seal device 30c of this embodiment has a first O-ring 35a and a second O-ring 35b as the pivot support bodies holding a pivotable body 31C pibotably to an intake nozzle 28C. The first O-ring 35a is housed in an O-ring groove formed on a base portion 28a2, which is located around a cylindrical projection 28b2 of a nozzle 28C. The first O-ring 35a corresponds to the O-ring 35 of the embodiments mentioned above, and has function similar thereto.

The second O-ring 35b is a ring-shaped seal member held to be compressively elastically deformable along directions (the X-axis and Y-axis plane directions) vertical to a longitudinal direction of the cylindrical projection 28b2 between an inner circumferential portion of the pivotable body 31C and an outer circumferential portion of the cylindrical projection 28b2.

In the present embodiment, the first O-ring 35a and the second O-ring 35b function as two seal members, which further improves seal performance between the nozzle 28C and the pivotable body 31C. By providing the second O-ring 35b, it is possible to effectively prevent the inner circumferential surface of the pivotable body 31C from impacting on the outer circumferential surface of the cylindrical projection 28b2 even if the pivotable body 31C pivots.

In the present embodiment, an O-ring groove is formed on the inner circumferential surface of the pivotable body 31C to provide the second O-ring 35b between the cylindrical projection 28b2 and the pivotable body 31C. A shallow groove for positioning the O-ring is also formed on the outer circumferential surface of the cylindrical projection 28b2 at a position corresponding to the O-ring groove in the Z-axis direction.

In the present embodiment, a contact part 34 is formed on a tip portion 33 of the pivotable body 31C. The contact part 34 is not formed by a ring-shaped convex, but is formed by a tapered slope where an outer diameter becomes small toward the tip. The tip of the contact part 34 goes into an intake opening 5a of an intake port 5, and an intermediate positional part of the tapered slope consisting the contact part 34 is then sealed by contacting with an inner edge of the intake opening 5a of the port 5. Other effects of the present embodiment are similar to the third embodiment shown in FIG. 4B except that effects based on having the second O-ring 35b are added.

Fifth Embodiment

Figure 4D:
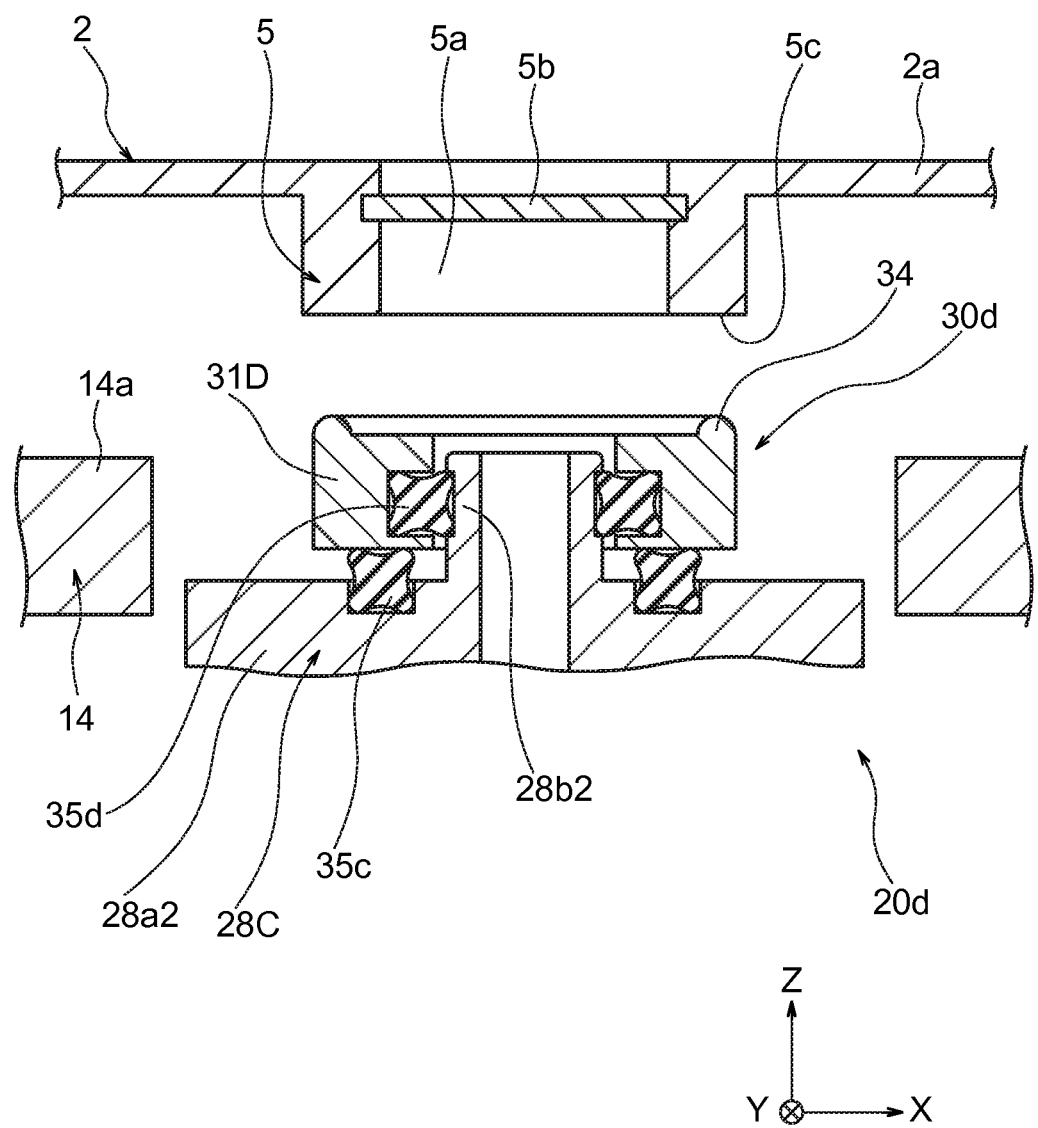
FIG. 4D is a cross sectional view of a main part of a pivotable seal device used for a gas purge unit according to further other embodiment of the present invention.

FIG. 4D is a cross sectional view of a main part of a pivotable seal device 30d used for a gas purge unit 20d according to further other embodiment of the present invention. The pivotable seal device 30d is used for either or both of intake and exhaust. Except for the following, the fifth embodiment has structures similar to the fourth embodiment mentioned above and demonstrates similar effects.

As shown in FIG. 4D, the pivotable seal device 30d of this embodiment is a variation of the pivotable seal device 30c of the embodiment shown in FIG. 4C and is different from the example shown in FIG. 4C in cross sectional shape of a first O-ring 35c and a second O-ring 35d. That is, although the cross sectional shape of the O-rings of the embodiments mentioned above is a circle, cross sectional shape of the O-rings 35c and 35d of this embodiment is a rectangle as a whole. Each side of the rectangle is dented, and corners thereof protrude.

The O-rings 35c and 35d with such a cross sectional shape are favorably housed in O-ring grooves and are hard to be displaced. Since the O-rings 35c and 35d can be compressively elastically deformed in a relatively wide range, a pivotable body 31d is expected to pivot in a wider range. Other effects of the present embodiment are similar to the fourth embodiment shown in FIG. 4C.

Note that, the present invention is not limited to the embodiments mentioned above, but can be variously changed within a scope thereof.

For example, the gas purge units 20 and 40 may not be necessarily comprised of the same structures, but may be comprised of different structures. For example, one of the gas purge units 20 and 40 may have one of the pivotable seal devices of FIG. 3A and FIG. 4A to FIG. 4D, and the other gas purge unit may have a pivotable seal device other than the pivotable seal device. Instead, either the gas purge unit 20 or 40 may be only comprised of structures of the gas purge unit according to the present invention.

In the above embodiments, the O-rings are used as pivot support bodies. However, in addition to the O-rings, other seal members compressively elastically deformable such as packing or gasket may be also used.

In the embodiments mentioned above, the gas purge unit of the present invention is applied to the load port apparatus 10, but may be applied to other devices. For example, the gas purge unit of the present invention may be attached to such as shelves or installation stands for spreading and storing a plurality of the containers 2. Instead, the gas purge unit of the present invention may be provided with other devices or places.

NUMERICAL REFERENCES

1 . . . wafer
2 . . . sealed transport container
2a . . . casing
2b . . . opening
2c . . . opening edge
3 . . . positioning portion
4 . . . lid
5 . . . intake port (circulating port)
5a . . . intake opening (circulating opening)
6 . . . exhaust port (circulating port)
6a . . . exhaust opening (circulating opening)
10 . . . load port apparatus
11 . . . wall member
12 . . . installation stand
13 . . . exchanging opening
14 . . . movable table
16 . . . positioning pin
18 . . . door
20, 20a to 20d . . . intake gas purge unit
22 . . . intake passage
24 . . . intake member
26 . . . nozzle opening
28, 28A . . . intake nozzle (nozzle member)
28a, 28a1, 28a2 . . . base portion
28b, 28b2 . . . cylindrical projection
30, 30a to 30d . . . intake pivotable seal device
31, 31B, 31C, 31D . . . pivotable body
32 . . . rear end
32a . . . outer engagement piece
33 . . . tip portion
34 . . . contact part
35 . . . O-ring (first pivot support portion)
35a, 35c . . . first O-ring (first pivot support portion)
35b, 35b . . . second O-ring (second pivot support portion)
36 . . . stopper member
36a . . . inner engagement piece
37 . . . bolt
40 . . . exhaust gas purge unit
42 . . . exhaust passage
44 . . . exhaust member
46 . . . nozzle opening
48 . . . exhaust nozzle (nozzle member)
50 . . . exhaust pivotable seal device
60 . . . semiconductor processing apparatus

The invention claimed is:

1. A gas purge unit for circulating a cleaning gas through a circulating port into a purging container having the circulating port with a circulating opening, comprising:
a nozzle member with a cylindrical projection having a nozzle opening for circulating the cleaning gas;
a pivotable body arranged in a ring shape to surround the cylindrical projection and provided with a contact part formed on a tip portion of the pivotable body to be able to detachably contact with the circulating port; and
a ring-shaped first pivot support portion held to be compressively elastically deformable along a longitudinal direction of the cylindrical projection between a rear end of the pivotable body and a base portion of the nozzle member.

2. The gas purge unit as set forth in claim 1, wherein the contact part is arranged to protrude toward the purging container more than a tip of the cylindrical projection.

3. The gas purge unit as set forth in claim 2, further comprising:
a ring-shaped second pivot support portion held to be compressively elastically deformable along a direction vertical to the longitudinal direction of the cylindrical projection between an inner circumferential portion of the pivotable body and an outer circumferential portion of the cylindrical projection.

4. The gas purge unit as set forth in claim 3, further comprising:
a stopper member for restricting the pivotable body to moving from the base portion of the nozzle member toward the circulating port, wherein the stopper member does not restrict the pivotable body to moving toward the base portion.

5. The gas purge unit as set forth in claim 2, further comprising:
a stopper member for restricting the pivotable body to moving from the base portion of the nozzle member toward the circulating port, wherein the stopper member does not restrict the pivotable body to moving toward the base portion.

6. The gas purge unit as set forth in claim 1, further comprising:
a ring-shaped second pivot support portion held to be compressively elastically deformable along a direction vertical to the longitudinal direction of the cylindrical projection between an inner circumferential portion of the pivotable body and an outer circumferential portion of the cylindrical projection.

7. The gas purge unit as set forth in claim 6, further comprising:
a stopper member for restricting the pivotable body to moving from the base portion of the nozzle member toward the circulating port, wherein the stopper member does not restrict the pivotable body to moving toward the base portion.

8. The gas purge unit as set forth in claim 1, further comprising:
a stopper member for restricting the pivotable body to moving from the base portion of the nozzle member toward the circulating port, wherein the stopper member does not restrict the pivotable body to moving toward the base portion.

9. The gas purge unit as set forth in claim 1, wherein the contact part is harder than a contact surface of an intake port on which the contact part contacts.

10. The gas purge unit as set forth in claim 1, wherein the contact part is a ring-shaped convex formed at the tip portion of the pivotable body.

11. The gas purge unit as set forth in claim 1, wherein the contact part is a tapered slope formed at the tip portion of the pivotable body.

12. A load port apparatus comprising the gas purge unit as set forth in claim 1.

13. An installation stand for a purging container having the gas purge unit as set forth in claim 1.

14. A gas purge unit for circulating a cleaning gas through a circulating port into a purging container having the circulating port with a circulating opening, comprising:
- a nozzle member with a nozzle opening for circulating the cleaning gas;
- a pivotable body arranged in a ring shape to surround the nozzle opening and provided with a contact part capable of detachably contacting with the circulating port;
- a ring-shaped pivot support portion held to be compressively elastically deformable between a rear end of the pivotable body and a base portion of the nozzle member; and
- a stopper member for restricting the pivotable body to moving from the base portion of the nozzle member toward the circulating port, wherein the stopper member does not restrict the pivotable body to moving toward the base portion.

15. The gas purge unit as set forth in claim 14, wherein the contact part is harder than a contact surface of an intake port on which the contact part contacts.

16. The gas purge unit as set forth in claim 14, wherein the contact part is a ring-shaped convex formed at the tip portion of the pivotable body.

17. The gas purge unit as set forth in claim 14, wherein the contact part is a tapered slope formed at the tip portion of the pivotable body.

18. A load port apparatus comprising the gas purge unit as set forth in claim 14.

19. An installation stand for a purging container having the gas purge unit as set forth in claim 14.

* * * * *